United States Patent
Bajuri et al.

(10) Patent No.: US 11,211,353 B2
(45) Date of Patent: Dec. 28, 2021

(54) CLIPS FOR SEMICONDUCTOR PACKAGES

(71) Applicant: Infineon Technologies AG, Neubiberg (DE)

(72) Inventors: Mohd Kahar Bajuri, Melaka (MY); Abdul Rahman Mohamed, Johor (MY); Siang Kuan Chua, Johor (MY); Ke Yan Tean, Melaka (MY)

(73) Assignee: Infineon Technologies AG, Neubiberg (DE)

(*) Notice: Subject to any disclaimer, the term of this patent is extended or adjusted under 35 U.S.C. 154(b) by 10 days.

(21) Appl. No.: 16/507,003

(22) Filed: Jul. 9, 2019

(65) Prior Publication Data
US 2021/0013171 A1 Jan. 14, 2021

(51) Int. Cl.
*H01L 23/00* (2006.01)

(52) U.S. Cl.
CPC .............. *H01L 24/40* (2013.01); *H01L 24/84* (2013.01); *H01L 2224/4001* (2013.01); *H01L 2224/4046* (2013.01); *H01L 2224/84815* (2013.01)

(58) Field of Classification Search
CPC . H01L 24/40; H01L 24/84; H01L 2224/4001; H01L 2224/84815
See application file for complete search history.

(56) References Cited

U.S. PATENT DOCUMENTS

| | | | |
|---|---|---|---|
| 8,975,117 B2 | 3/2015 | Otremba et al. | |
| 8,987,879 B2 | 3/2015 | Otremba | |
| 9,418,918 B2 * | 8/2016 | Groenhuis | H01L 23/49524 |
| 2004/0130034 A1 * | 7/2004 | Alvarez | H01L 24/10 257/762 |
| 2007/0200250 A1 * | 8/2007 | Koenigsberger | H01L 23/49562 257/778 |
| 2007/0259514 A1 * | 11/2007 | Otremba | H01L 24/13 438/612 |
| 2008/0169537 A1 * | 7/2008 | Kajiwara | H01L 23/49575 257/666 |
| 2008/0314159 A1 * | 12/2008 | Sykes | G01N 3/24 73/842 |
| 2009/0039484 A1 * | 2/2009 | Mahler | H01L 24/29 257/676 |
| 2013/0009295 A1 * | 1/2013 | Otremba | H01L 23/49524 257/676 |
| 2013/0146991 A1 * | 6/2013 | Otremba | H01L 24/96 257/401 |
| 2013/0249067 A1 * | 9/2013 | Ng | H01L 23/49579 257/670 |

(Continued)

FOREIGN PATENT DOCUMENTS

| | | |
|---|---|---|
| DE | 2118431 | 11/1971 |
| GB | 1326498 | 4/1971 |

(Continued)

*Primary Examiner* — Nathan W Ha
(74) *Attorney, Agent, or Firm* — Dicke, Billig & Czaja, PLLC

(57) ABSTRACT

A clip for a semiconductor package and a semiconductor having a clip is disclosed. In one example, the clip includes a first planar portion, a plurality of first pillars, and a plurality of first solder balls. Each first pillar of the plurality of first pillars is coupled to the first planar portion. Each first solder ball of the plurality of first solder balls is coupled to a corresponding first pillar of the plurality of first pillars.

24 Claims, 5 Drawing Sheets

(56) References Cited

U.S. PATENT DOCUMENTS

| | | | |
|---|---|---|---|
| 2014/0001480 A1* | 1/2014 | Otremba | H01L 23/49575 257/76 |
| 2014/0054758 A1* | 2/2014 | Yilmaz | H01L 23/49562 257/669 |
| 2014/0252607 A1* | 9/2014 | Miyauchi | B23K 35/3613 257/737 |
| 2014/0354314 A1* | 12/2014 | Arora | G01R 31/2874 324/750.09 |
| 2017/0069563 A1* | 3/2017 | Miyakawa | H01L 24/41 |
| 2018/0053712 A1 | 2/2018 | St. Germain et al. | |
| 2018/0240770 A1* | 8/2018 | Choi | H01L 23/49575 |

FOREIGN PATENT DOCUMENTS

| | | |
|---|---|---|
| JP | H0373562 | 3/1991 |
| JP | 2003-115512 | 4/2003 |
| JP | 2003-273356 | 9/2003 |

\* cited by examiner

CLIPS FOR SEMICONDUCTOR PACKAGES

BACKGROUND

A clip may be used to electrically couple components of a semiconductor package to each other. The clip is typically coupled to each component of the semiconductor package using a single area of solder for each component. Each single area of solder may be about the same size as the portion of the clip to be coupled to each component. Each single area of solder may result in significant and random solder bleed on each component, which may result in shorting each component to adjacent components.

For these and other reasons, a need exists for the present disclosure.

SUMMARY

One example of a clip for a semiconductor package includes a first planar portion, a plurality of first pillars, and a plurality of first solder balls. Each first pillar of the plurality of first pillars is coupled to the first planar portion. Each first solder ball of the plurality of first solder balls is coupled to a corresponding first pillar of the plurality of first pillars.

One example of a semiconductor package includes a first electrically conductive component, a second electrically conductive component, and a clip electrically coupling the first electrically conductive component to the second electrically conductive component. The clip includes a first planar portion, a plurality of first pillars, a second planar portion, and a third portion. Each first pillar of the plurality of first pillars is coupled between the first planar portion and the first electrically conductive component. The second planar portion is coupled to the second electrically conductive component. The third portion couples the first planar portion to the second planar portion.

One example of a method for fabricating a semiconductor package includes placing a clip including a plurality of pillars and a corresponding plurality of solder balls coupled to the plurality of pillars on a first electrically conductive component and a second electrically conductive component. The method further includes reflowing the solder balls to electrically couple the first electrically conductive component to the second electrically conductive component via the clip.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Figure 1A:
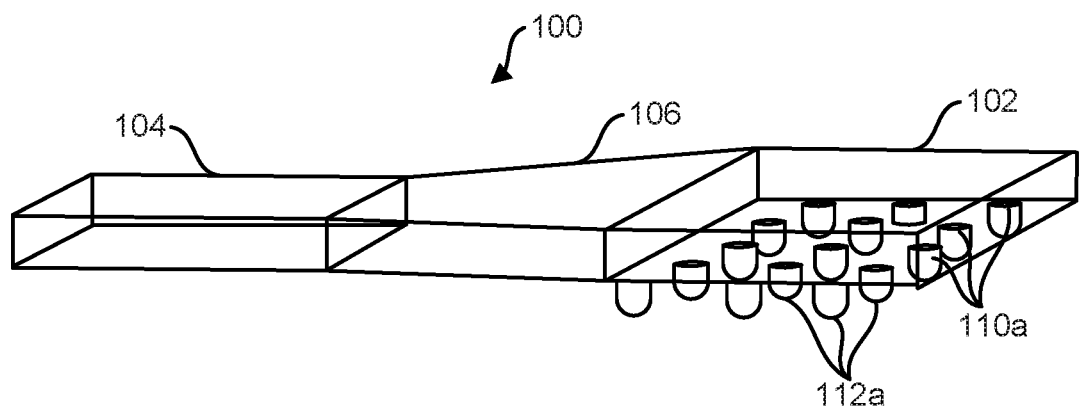
FIGS. 1A-1E illustrate examples of clips for a semiconductor package.

FIG. 1A illustrates one example of a clip 100 for a semiconductor package. Clip 100 includes a first planar portion 102, a second planar portion 104, and a third portion 106 coupling the first planar portion 102 to the second planar portion 104. In one example, the first planar portion 102 and the second planar portion 104 may have different sizes as shown in FIG. 1A. In other examples, the first planar portion 102 and the second planar portion 104 may be the same size. Clip 100 also includes a plurality of first pillars 110a and a plurality of first solder balls 112a. Each first pillar 110a is coupled to the first planar portion 102 at a first end of each first pillar 110a. Each first solder ball 112a is coupled to a corresponding first pillar 110a at a second end of each first pillar 110a opposite to the first end of each first pillar 110a. Clip 100 is made of a metal and may be plated. Clip 100 may include copper, aluminum, gold, or another suitable metal or combination of metals.

While in FIG. 1A, the first planar portion 102 and the second planar portion 104 are in the same plane, in other examples the first planar portion 102 and the second planar portion 104 may be in different planes. With the first planar portion 102 and the second planar portion 104 in different planes, the second portion 106 may include an upward or downward bend to couple the first planar portion 102 to the second planar portion 104. In addition, while in FIG. 1A the first planar portion 102, the second planar portion 104, and the third portion 106 each have the same thickness In other examples the first planar portion 102, the second planar portion 104, and/or the third portion 106 may have different thicknesses. The first planar portion 102, the second planar portion 104, and the third portion 106 may each have a thickness within a range between 50 µm and 200 µm.

Figure 1B:
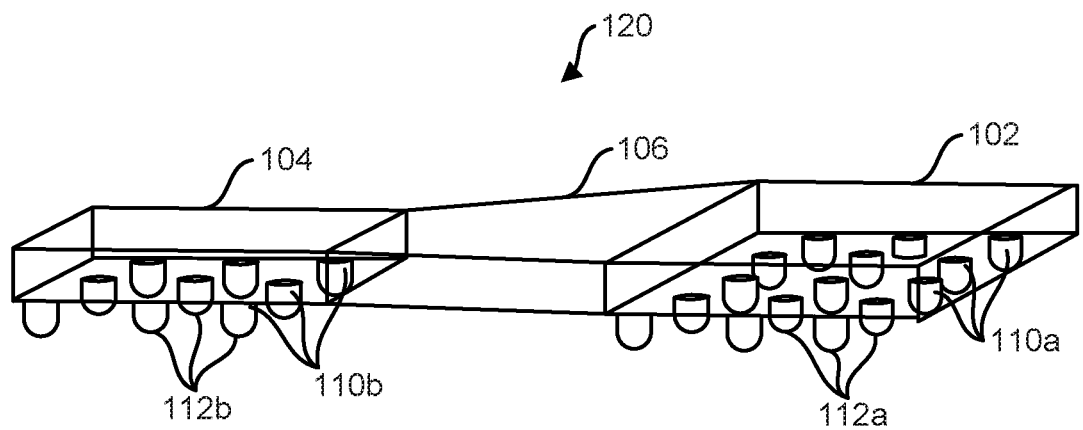

FIG. 1B illustrates another example of a clip 120 for a semiconductor package. Clip 120 is similar to clip 100 previously described and illustrated with reference to FIG. 1A, except that clip 120 includes a plurality of second pillars 110b and a plurality of second solder balls 112b. Each second pillar 110b is coupled to the second planar portion 104 at a first end of each second pillar 110b. Each second solder ball 112b is coupled to a corresponding second pillar 110b at a second end of each second pillar 110b opposite to the first end of each second pillar 110b.

In this example, each first pillar 110a and each second pillar 110b are cylindrically shaped. In other examples, each first pillar 110a and each second pillar 110b may have another suitable shape, such as an ellipse shape, a rectangular shape, a hexagonal shape, a triangular shape, etc. In one example, each first pillar 110a and each second pillar 110b may have a height (e.g., the length between the corresponding first planar portion 102 or second planar portion 104 and the corresponding solder balls 112a or 112b) up to 80 µm, such as 50 µm, 60 µm, 70 µm, or 80 µm. In other examples, each first pillar 110a and each second pillar 110b may have a height greater than 80 µm, such as 90 µm, 100 µm, or 110 µm. In one example, each first pillar 110a and each second pillar 110b may have a diameter (e.g., a width along a direction perpendicular to the height) of 0.25 mm or larger, such as 0.30 mm, 0.35 mm, or 0.40 mm. In other examples, each first pillar 110a and each second pillar 110b may have a diameter of 0.25 mm or smaller, such as 0.20 mm. In one example, the plurality of first pillars 110a and the plurality of second pillars 110b may be arranged in a symmetric pattern. In other examples, the plurality of first pillars 110a and the plurality of second pillars 110b may be arranged in an asymmetric pattern.

The first planar portion 102 and the second planar portion 104 may be integral to the third portion 106 (e.g., formed from a single piece of metal). In some examples, each first pillar 110a and each second pillar 110b may be integral to the first planar portion 102 and the second planar portion 104, respectively. In this case, clip 120 may be fabricated by stamping or embossing a metal plate to form each first pillar 110a and each second pillar 110b. Alternatively, clip 120 may be fabricated by etching a metal plate to form each first pillar 110a and each second pillar 110b or by metal casting to form clip 120 including each first pillar 110a and each second pillar 110b. In other examples, each first pillar 110a and each second pillar 110b may not be integral to the first planar portion 102 and the second planar portion 104, respectively. In this case, clip 120 may be fabricated by welding each first pillar 110a and each second pillar 110b to the first planar portion 102 and the second planar portion 104, respectively. Alternatively, clip 120 may be fabricated by soldering or sintering each first pillar 110a and each second pillar 110b to the first planar portion 102 and the second planar portion 104, respectively. In another example, clip 120 may be fabricated by attaching each first pillar 110a and each second pillar 110b to the first planar portion 102 and the second planar portion 104, respectively, via an adhesive material. In yet another example, clip 120 may be fabricated by forming the first planar portion 102 and the second planar portion 104 with small holes in which first pillars 110a and the second pillars 110b are press fit, respectively.

Figure 1C:
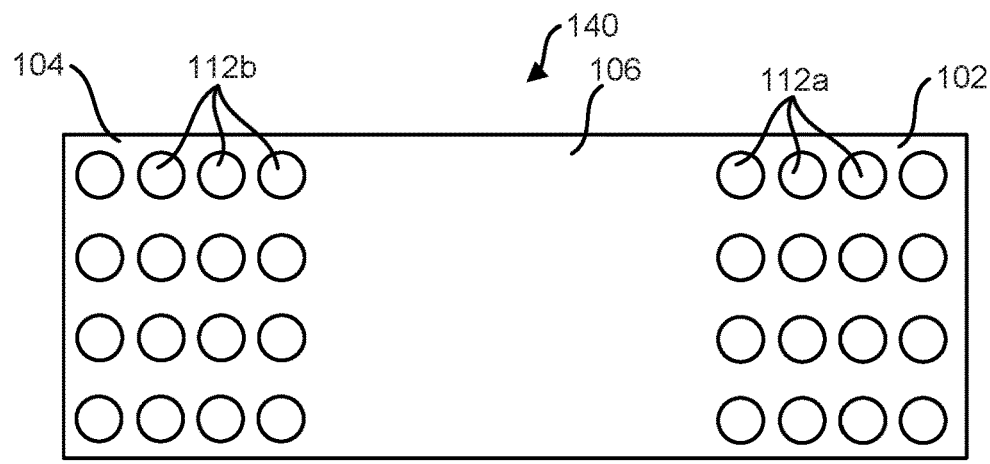

FIG. 1C illustrates a bottom view of one example of a clip 140. Clip 140 includes a first planar portion 102, a second planar portion 104, and a third portion 106 coupling the first planar portion 102 to the second planar portion 104. Clip 140 also includes a plurality of first pillars 110a (not visible), a plurality of first solder balls 112a, a plurality of second pillars 110b (not visible), and a plurality of second solder balls 112b. In this example, the plurality of first pillars 110a and corresponding first solder balls 112a and the plurality of second pillars 110b and corresponding second solder balls 112b are arranged in a symmetric pattern.

As shown in FIG. 1C, each of the first solder balls 112a (and corresponding first pillars) and each of the second solder balls 112b (and corresponding second pillars) are spaced apart from adjacent solder balls (and corresponding pillars). The spacing between the first solder balls 112a (and corresponding first pillars) and between the second solder balls 112b (and corresponding second pillars) as well as the number of first solder balls 112a (and corresponding first pillars) and the number of second solder balls 112b (and corresponding second pillars) may be selected based on a variety of factors, including but not limited to the size of the first portion 102 and the second portion 104, the height and/or diameter of each first pillar and each second pillar, the size of each solder ball 112a and 112b, and the desired current density for the clip.

Figure 1D:
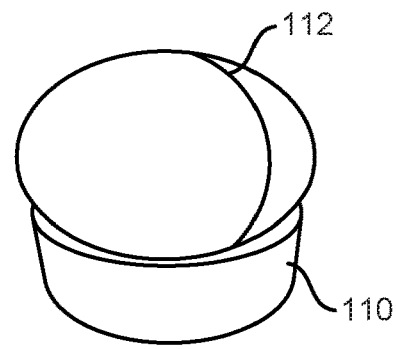

FIG. 1D illustrates an enlarged view of one example of a pillar 110 and a solder ball 112. In one example, each first pillar 110a and corresponding first solder ball 112a and each second pillar 110b and corresponding second solder ball 112b is similar to pillar 110 and solder ball 112 of FIG. 1D. As shown in FIG. 1D, solder ball 112 may have a diameter greater than the diameter of the pillar 110. In other examples, solder ball 112 may have a diameter less than the diameter of the pillar 110. The solder ball 112 may be attached to pillar 110 using a solder plating process or another suitable process.

Figure 1E:
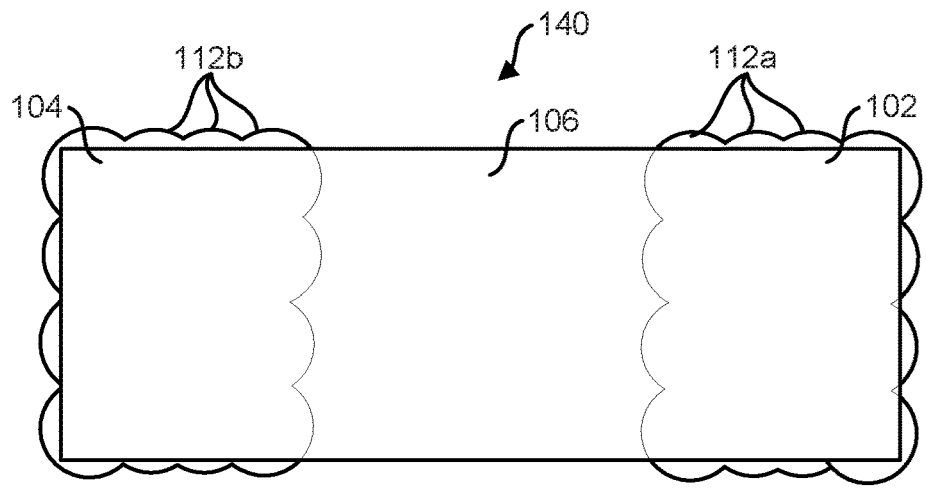

FIG. 1E illustrates a top view of one example of clip 140 of FIG. 1C after reflowing the solder balls 112a and 112b. In this example, after reflowing the solder balls 112a and 112b, the solder extends completely between adjacent first pillars and adjacent second pillars, respectively. The solder, however, maintains its general circular shape around each pillar such that any solder bleed is small and predictable in shape. This is in contrast to when a single area of solder is used where solder bleed may be large and unpredictable in shape. In other examples, after reflowing the solder balls 112a and 112b, the reflowed solder balls may remain spaced apart from each other such that each reflowed solder ball does not contact adjacent reflowed solder balls.

Figure 2:
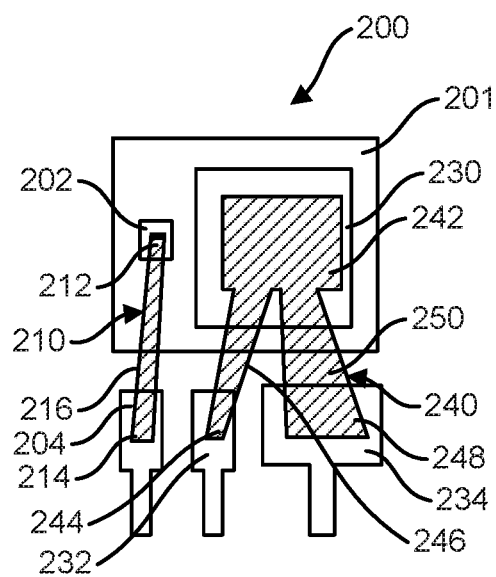
FIG. 2 illustrates a top view of one example of a semiconductor package.

FIG. 2 illustrates a top view of one example of a semiconductor package 200. Semiconductor package 200 includes a first electrically conductive component 202, a second electrically conductive component 204, and a clip 210 electrically coupling the first electrically conductive component 202 to the second electrically conductive component 204. Clip 210 may be similar to clip 100 or clip 120 previously described and illustrated with reference to FIGS. 1A and 1B. Clip 210 includes a first planar portion 212, a second planar portion 214, and a third portion 216 coupling the first planar portion 212 to the second planar portion 214. The first planar portion 212 is coupled to the first electrically conductive component 202. The first planar portion 212 may be coupled to the first electrically conductive component 202 via a plurality of first pillars coupled between the first planar portion 212 and the first electrically conductive component 202 as will be described below with reference to FIGS. 3-6. The second planar portion 214 is coupled to the second electrically conductive component 204. The second planar portion 214 may be coupled to the second electrically conductive component 204 via a plurality of second pillars coupled between the second planar portion 214 and the second electrically conductive component 204 as will be described below with reference to FIGS. 3-6.

Semiconductor package 200 also includes a third electrically conductive component 230, a fourth electrically conductive component 232, a fifth electrically conductive component 234, and a clip 240 electrically coupling the third electrically conductive component 230 to the fourth electrically conductive component 232 and the fifth electrically conductive component 234. Clip 240 may be similar to clip 100 or clip 120 previously described and illustrated with reference to FIGS. 1A and 1B, except that clip 240 includes an additional portion such that clip 240 electrically couples three electrically conductive components to each other. Clip 240 includes a first planar portion 242, a second planar portion 244, and a third portion 246 coupling the first planar portion 242 to the second planar portion 244. In addition, clip 240 includes a fourth planar portion 248 and a fifth portion 250 coupling the fourth planar portion 248 to the first planar portion 242.

The first planar portion 242 is coupled to the third electrically conductive component 230. The first planar portion 242 may be coupled to the third electrically conductive component 230 via a plurality of first pillars coupled between the first planar portion 242 and the third electrically conductive component 230. The second planar portion 244 is coupled to the fourth electrically conductive component 232. The second planar portion 244 may be coupled to the fourth electrically conductive component 232 via a plurality of second pillars coupled between the second planar portion 244 and the fourth electrically conductive component 232. The fourth planar portion 248 is coupled to the fifth electrically conductive component 234. The fourth planar portion 248 may be coupled to the fifth electrically conductive component 234 via a plurality of third pillars coupled between the fourth planar portion 248 and the fifth electrically conductive component 234.

In this example, first electrically conductive component 202 and third electrically conductive component 230 are dies attached to a die pad 201, and second electrically conductive component 204, fourth electrically conductive component 232, and fifth electrically conductive component 234 are leads of a lead frame. In other examples, however, each electrically conductive component 202, 204, 230, 232, and 234 may include a die, a lead frame, or a carrier. It is understood that a clip may be configured to electrically couple any suitable number of electrically conductive components (e.g., dies, lead frames, carriers, etc.) of a semiconductor package to each other and that a semiconductor package may include a single clip or multiple clips.

Figure 3:
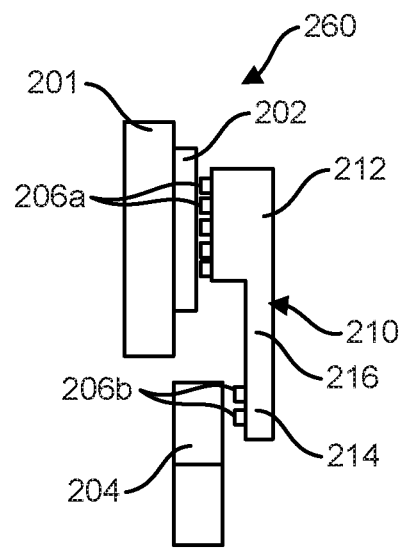
FIG. 3 illustrates an exploded side view of one example of a semiconductor package.

FIG. 3 illustrates an exploded side view of one example of a semiconductor package 260. Semiconductor package 260 is similar to semiconductor package 200 of FIG. 2. Semiconductor package 260 includes a plurality of first pillars 206a and a plurality of second pillars 206b. Semiconductor package 260 may also include a plurality of first solder balls, where each first solder ball is coupled to a corresponding first pillar 206a. Semiconductor package 260 may also include a plurality of second solder balls, where each second solder ball is coupled to a corresponding second pillar 206b. The first solder balls and the second solder balls are coupled to the first pillars 206a and the second pillars 206b, respectively, prior to coupling the clip 210 to the first electrically conductive component 202 and the second electrically conductive component 204.

In this example, prior to coupling the clip 210 to the first electrically conductive component 202 and the second electrically conductive component 204, each first pillar 206a is coupled to the first planar portion 212 of the clip 210, and each second pillar 206b is coupled to the second planar portion 214 of the clip 210. Each first pillar 206a and each second pillar 206b may be integral (e.g., via stamping, embossing, etching, casting, etc.) to the clip 210 or attached (e.g., via soldering, sintering, welding, etc.) to the clip 210 as previously described.

Figure 4:
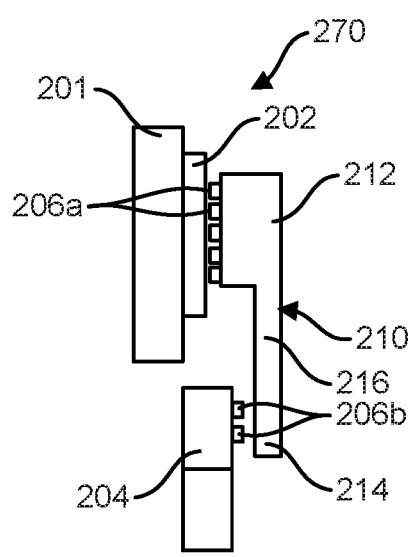
FIG. 4 illustrates an exploded side view of another example of a semiconductor package.

FIG. 4 illustrates an exploded side view of another example of a semiconductor package 270. Semiconductor package 270 is similar to semiconductor package 260 of FIG. 3, except that in semiconductor package 270 each second pillar 206b is coupled to the second electrically conductive component 204 prior to coupling the clip 210 to the first electrically conductive component 202 and the second electrically conductive component 204. Each second pillar 206b may be integral (e.g., via stamping, embossing, etching, casting, etc.) to the second electrically conductive component 204 or attached (e.g., via soldering, sintering, welding, etc.) to the second electrically conductive component 204.

Figure 5:
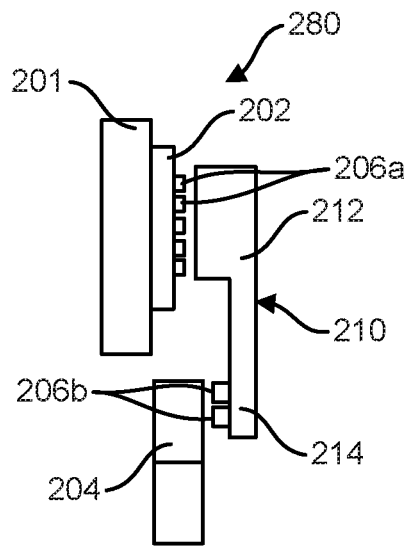
FIG. 5 illustrates an exploded side view of another example of a semiconductor package.

FIG. 5 illustrates an exploded side view of another example of a semiconductor package 280. Semiconductor package 280 is similar to semiconductor package 260 of FIG. 3, except that in semiconductor package 280 each first pillar 206a is coupled to the first electrically conductive component 202 prior to coupling the clip 210 to the first electrically conductive component 202 and the second electrically conductive component 204. Each first pillar 206a may be integral (e.g., via stamping, embossing, etching, casting, etc.) to the first electrically conductive component 202 or attached (e.g., via soldering, sintering, welding, etc.) to the first electrically conductive component 202.

Figure 6:
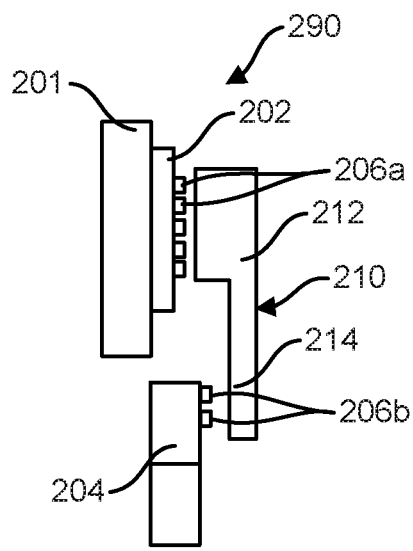
FIG. 6 illustrates an exploded side view of another example of a semiconductor package.

FIG. 6 illustrates an exploded side view of another example of a semiconductor package 290. Semiconductor package 290 is similar to semiconductor package 260 of FIG. 3, except that in semiconductor package 290 each first pillar 206a is coupled to the first electrically conductive component 202 and each second pillar 206b is coupled to the second electrically conductive component 204 prior to coupling the clip 210 to the first electrically conductive component 202 and the second electrically conductive component 204. Each first pillar 206a and each second pillar 206b may be integral (e.g., via stamping, embossing, etching, casting, etc.) to the first electrically conductive component 202 and the second electrically conductive component 204 or attached (e.g., via soldering, sintering, welding, etc.) to the first electrically conductive component 202 and the second electrically conductive component 204, respectively.

Figure 7:
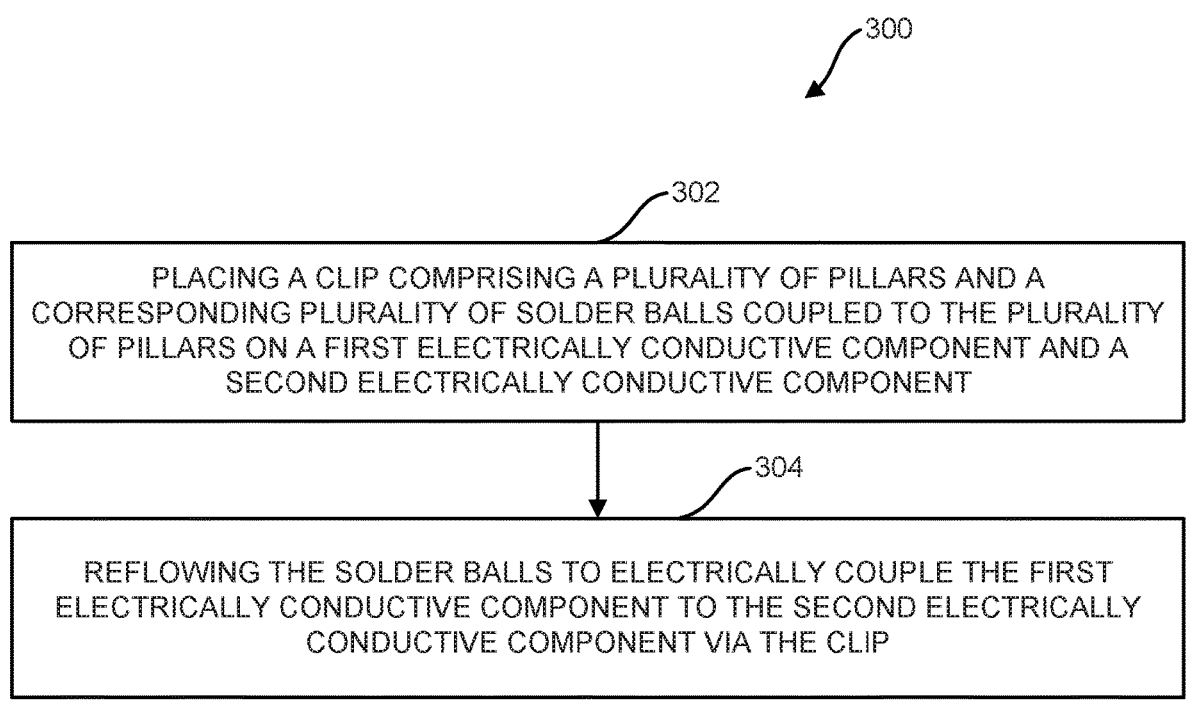
FIG. 7 is a flow diagram illustrating one example of a method for fabricating a semiconductor package.

FIG. 7 is a flow diagram illustrating one example of a method 300 for fabricating a semiconductor package. In one example, method 300 may be used to fabricate semiconductor device 200 of FIG. 2, semiconductor device 260 of FIG. 3, semiconductor device 270 of FIG. 4, and/or semiconductor device 280 of FIG. 5. At 302, method 300 includes placing a clip comprising a plurality of pillars and a corresponding plurality of solder balls coupled to the plurality of pillars on a first electrically conductive component and a second electrically conductive component. At 304, method 300 includes reflowing the solder balls to electrically couple the first electrically conductive component to the second electrically conductive component via the clip. The first electrically conductive component may include a die and the second electrically conductive component may include a lead frame. In one example, reflowing the solder balls includes reflowing the solder balls such that solder extends completely between adjacent pillars of the plurality of pillars. In another example, reflowing the solder balls comprises reflowing the solder balls such that the reflowed solder balls are spaced apart from each other.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A clip for a semiconductor package, the clip comprising:
a first planar portion;
a plurality of first pillars, each first pillar of the plurality of first pillars coupled to a first side of the first planar portion and spaced apart from all edges of the first side of the first planar portion; and
a plurality of first solder balls, each first solder ball of the plurality of first solder balls coupled to a corresponding first pillar of the plurality of first pillars.

2. The clip of claim 1, further comprising:
a second planar portion;
a third portion coupling the first planar portion to the second planar portion;
a plurality of second pillars, each second pillar of the plurality of second pillars coupled to the second planar portion; and
a plurality of second solder balls, each second solder ball of the plurality of second solder balls coupled to a corresponding second pillar of the plurality of second pillars.

3. The clip of claim 2, wherein the first planar portion and the second planar portion are in different planes.

4. The clip of claim 1, wherein each first pillar of the plurality of first pillars is cylindrically shaped.

5. The clip of claim 1, wherein each first pillar of the plurality of first pillars has a height up to 80 μm.

6. The clip of claim 1, wherein each first pillar of the plurality of first pillars has a diameter of 0.25 mm or larger.

7. The clip of claim 1, wherein the plurality of first pillars are arranged in a symmetric pattern.

8. The clip of claim 1, wherein each first pillar of the plurality of first pillars is integral to the first planar portion.

9. The clip of claim 1, wherein each first pillar of the plurality of first pillars is welded to the first planar portion.

10. The clip of claim 1, wherein each first pillar of the plurality of first pillars is soldered or sintered to the first planar portion.

11. A semiconductor package comprising:
a first electrically conductive component;
a second electrically conductive component; and
a clip electrically coupling the first electrically conductive component to the second electrically conductive component, the clip comprising:
a first planar portion;
a plurality of first pillars, each first pillar of the plurality of first pillars coupled between a first side of the first planar portion and the first electrically conductive component and spaced apart from all edges of the first side of the first planar portion;
a second planar portion coupled to the second electrically conductive component; and
a third portion coupling the first planar portion to the second planar portion.

12. The semiconductor package of claim 11, wherein the clip further comprises:
a plurality of second pillars, each second pillar of the plurality of second pillars coupled between the second planar portion and the second electrically conductive component.

13. The semiconductor package of claim 11, wherein the first electrically conductive component comprises a first die, a first lead frame, or a first carrier, and
wherein the second electrically conductive component comprises a second die, a second lead frame, or a second carrier.

14. The semiconductor package of claim 11, wherein each first pillar of the plurality of first pillars is coupled to the first electrically conductive component via a plurality of corresponding reflowed first solder balls.

15. The semiconductor package of claim 11, wherein each first pillar of the plurality of first pillars is coupled to the first planar portion via an adhesive material.

16. The semiconductor package of claim 11, wherein each first pillar of the plurality of first pillars is press fit to the first planar portion.

17. A method for fabricating the semiconductor package of claim 1, the method comprising:
placing a clip comprising a plurality of pillars and a corresponding plurality of solder balls coupled to the plurality of pillars on a first electrically conductive component and a second electrically conductive component; and
reflowing the solder balls to electrically couple the first electrically conductive component to the second electrically conductive component via the clip.

18. The method of claim 17, wherein the first electrically conductive component comprises a die, and
wherein the second electrically conductive component comprises a lead frame.

19. The method of claim 17, wherein reflowing the solder balls comprises reflowing the solder balls such that solder extends completely between adjacent pillars of the plurality of pillars.

20. The method of claim 17, wherein reflowing the solder balls comprises reflowing the solder balls such that the reflowed solder balls are spaced apart from each other.

21. A clip for a semiconductor package, the clip comprising:
a first planar portion;
a plurality of first pillars, each first pillar of the plurality of first pillars coupled to the first planar portion;
a plurality of first solder balls, each first solder ball of the plurality of first solder balls coupled to a corresponding first pillar of the plurality of first pillars;
a second planar portion;
a third portion coupling the first planar portion to the second planar portion;
a fourth planar portion; and
a fifth portion coupling the first planar portion to the fourth planar portion.

22. The clip of claim 21, further comprising:
a plurality of second pillars, each second pillar of the plurality of second pillars coupled to the second planar portion; and
a plurality of second solder balls, each second solder ball of the plurality of second solder balls coupled to a corresponding second pillar of the plurality of second pillars.

23. The clip of claim 22, further comprising:
a plurality of third pillars, each third pillar of the plurality of third pillars coupled to the fourth planar portion; and
a plurality of third solder balls, each third solder ball of the plurality of third solder balls coupled to a corresponding third pillar of the plurality of third pillars.

24. The clip of claim 21, wherein each first pillar of the plurality of first pillars is coupled to a first side of the first planar portion and spaced apart from all edges of the first side of the first planar portion.

* * * * *